(12) United States Patent
Gambin et al.

(10) Patent No.: US 9,484,284 B1
(45) Date of Patent: Nov. 1, 2016

(54) MICROFLUIDIC IMPINGEMENT JET COOLED EMBEDDED DIAMOND GAN HEMT

(71) Applicants: NORTHROP GRUMMAN SYSTEMS CORPORATION, Falls Church, VA (US); GENERAL ELECTRIC COMPANY, Schenectady, NY (US)

(72) Inventors: Vincent Gambin, Rancho Palos Verdes, CA (US); Benjamin D. Poust, Hawthorne, CA (US); Dino Ferizovic, Torrance, CA (US); Stanton E. Weaver, Broadalbin, NY (US); Gary D. Mandrusiak, Latham, NY (US)

(73) Assignees: Northrop Grumman Systems Corporation, Falls Church, VA (US); General Electric Company, Schenectady, NY (US)

( * ) Notice: Subject to any disclaimer, the term of this patent is extended or adjusted under 35 U.S.C. 154(b) by 0 days.

(21) Appl. No.: 15/072,242

(22) Filed: Mar. 16, 2016

(51) Int. Cl.
| | |
|---|---|
| H01L 33/32 | (2010.01) |
| H01L 29/20 | (2006.01) |
| H01L 21/02 | (2006.01) |
| H01L 23/473 | (2006.01) |

(Continued)

(52) U.S. Cl.
CPC ....... *H01L 23/4735* (2013.01); *H01L 23/3677* (2013.01); *H01L 23/3732* (2013.01); *H01L 23/66* (2013.01); *H01L 27/095* (2013.01); *H01L 29/2003* (2013.01); *H01L 29/205* (2013.01); *H01L 29/7784* (2013.01); *H03F 3/195* (2013.01); *H03F 3/1935* (2013.01); *H03F 3/213* (2013.01); *H01L 2223/6644* (2013.01); *H01L 2223/6683* (2013.01); *H03F 2200/451* (2013.01)

(58) Field of Classification Search
CPC ..... H01L 33/32; H01L 33/007; H01L 29/20; H01L 29/2003; H01L 21/02; H01L 21/02458; H01L 21/0254
USPC .......................................................... 257/76
See application file for complete search history.

(56) References Cited

U.S. PATENT DOCUMENTS

| | | |
|---|---|---|
| 7,157,793 B2 | 1/2007 | Torkington et al. |
| 7,548,424 B2 | 6/2009 | Altman et al. |

(Continued)

OTHER PUBLICATIONS

Xie, Chenggang et al. "Experimental Evaluation of Direct Liquid Cooling on GaN HEMT Based Power Amplifier MMIC" Advanced Technology Center IEEE 2015, 4 pgs.

(Continued)

*Primary Examiner* — Monica D Harrison
(74) *Attorney, Agent, or Firm* — John A. Miller; Miller IP Group, PLC

(57) ABSTRACT

A MMIC power amplifier circuit assembly comprised of a SiC substrate having a plurality of microchannels formed therein, where a diamond layer is provided within each of the microchannels. A plurality of GaN HEMT devices are provided on the substrate where each HEMT device is positioned directly opposite to a microchannel. A silicon manifold is coupled to the substrate and includes a plurality of micro-machined channels formed therein that include a jet impingement channel positioned directly adjacent each microchannel, a return channel directly positioned adjacent to each microchannel, a supply channel supplying a cooling fluid to the impingement channels and a return channel collecting heated cooling fluid from the supply channels so that an impingement jet is directed on to the diamond layer for removing heat generated by the HEMT devices.

20 Claims, 2 Drawing Sheets

(51) Int. Cl.
    *H01L 29/205*     (2006.01)
    *H01L 29/778*     (2006.01)
    *H01L 23/367*     (2006.01)
    *H01L 23/373*     (2006.01)
    *H01L 27/095*     (2006.01)
    *H01L 23/66*     (2006.01)
    *H03F 3/213*     (2006.01)
    *H03F 3/193*     (2006.01)
    *H03F 3/195*     (2006.01)

(56) References Cited

U.S. PATENT DOCUMENTS

| | | |
|---|---|---|
| 8,082,978 B2 | 12/2011 | Fedorov |
| 8,470,701 B2 | 6/2013 | Rogers et al. |
| 8,575,657 B2 | 11/2013 | Gambin et al. |
| 8,714,715 B2 * | 5/2014 | Koseki ............... B41J 2/14209 347/68 |
| 8,912,643 B2 | 12/2014 | de Bock et al. |
| 8,987,892 B2 | 3/2015 | Davis et al. |
| 9,023,688 B1 | 5/2015 | Or-Bach et al. |
| 9,196,703 B2 | 11/2015 | Hobart et al. |
| 2006/0162365 A1 | 7/2006 | Hoang et al. |
| 2007/0215325 A1 | 9/2007 | Solovitz et al. |

OTHER PUBLICATIONS

Chen, Xiuping, Yvette, "Embedded Active and Passive Methods to Reduce the Junction Temperature of Power and RF Electronics" A Thesis, May 2014, 122 pgs.

Ditri, John et al., "Embedded Microfluidic Cooling of High Heat Flux Electronic Components" Mission Systems and Training, IEEE, 2014, 4 pgs.

Bar-Cohen, Avram et al., "DARPA's Intra/Interchip Enhanced Cooling (ICECool) Program" CS MANTECH Conference, May 13-16, 2013, pp. 171-173.

Cho, Jungwan et al., "Improved Thermal Interfaces of GaN-Diamond Composite Substrates for HEMT Applications" IEEE Transactions on Components, Packaging and Manufacturing Technology, vol. 3, No. 1, Jan. 2013, pp. 79-85.

Han, Yong et al., "Thermal Management of Hotspots With a Microjet-Based Hybrid Heat Sink for GaN-on-Si Devices" IEEE, pp. 1-10.

* cited by examiner

MICROFLUIDIC IMPINGEMENT JET COOLED EMBEDDED DIAMOND GAN HEMT

GOVERNMENT CONTRACT

This invention was made with Government support under contract FA8650-14-C-7465 awarded by Air Force Research Laboratory. The Government has certain rights in the invention.

BACKGROUND

1. Field

This invention relates generally to a semiconductor circuit including one or more semiconductor devices, where each device is liquid cooled and, more particularly, to a semiconductor circuit including a plurality of GaN semiconductor devices fabricated on a common substrate, where the substrate includes a diamond heat removal layer formed in a microchannel below each device, and where a manifold is mounted to the substrate that includes impingement jets that spray a liquid cooling fluid onto the diamond layers.

2. Discussion

Integrated circuits are typically fabricated by epitaxial fabrication processes that deposit or grow various semiconductor layers on a wafer substrate to provide the circuit components for the device. Substrates for integrated circuits can include various materials, usually semiconductor materials, such as silicon, sapphire, SiC, InP, GaAs, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

Virtually all electronic components operate in a thermally limited capacity, that is, the performance of the device is limited by the amount of heat that can be dissipated from the device to the environment. The amount of thermal dissipation is proportional to the operating voltages, currents and frequencies of the device, where any increase results in higher power dissipation and thus waste heat. The rise of the electronic device junction temperature in the device is proportional to the thermal resistance between the device channel or junctions and the point at which the heat is released to the environment. Every device has a maximum junction temperature, where operation of the device beyond that temperature results in diminished performance and reliability due to basic limitations of the semiconductor and packaging materials. The desire to operate at higher powers (voltage, current, and/or frequency) drives the need for a reduction in thermal resistance.

One example of these types of devices includes gallium nitride (GaN)-based RF and microwave power amplifiers. GaN is a wide bandgap semiconductor and GaN-based high electron mobility transistors (HEMTs) have the ability to operate at both high current and high voltage. This type of operation coupled with fine geometries results in megawatt per square centimeter ($MW/cm^2$) power densities near the gate finger of the device. GaN HEMT devices are typically epitaxially grown on a suitable substrate for these applications, where the substrate needs to be highly thermally conductive, electrically insulative, have a thermal expansion coefficient similar to GaN and provide lattice constant matching for suitable epitaxial growth. Suitable materials that are both highly thermally conductive and electrically insulative are relatively unique.

A high thermally conductive substrate for these devices is necessary so that heat is removed from the device junction through the epitaxial layers and the substrate so that the device is able to operate at high power in a reliable manner. Particularly, as mentioned above, as the temperature of the device increases above some threshold temperature, the electrical performance of the device is reduced, which reduces its high power capability. Further, too high of a temperature within the device reduces its reliability because its time to failure will be reduced. Also, these types of devices are typically high frequency devices, which become smaller in size, which reduces the spacing between gate fingers and device unit cells, as the frequency increases, which reduces their ability to withdraw heat. The conductive path for heat generated at the device junction layer in an HEMT device causes the heat to propagate through the epitaxial layers and the substrate and into the device packaging. Therefore, it is necessary to provide a high thermally conductive substrate that does not impede the path of the heat exiting the device, and allows the heat to spread out over a larger area. The thickness of the substrate is optimized to provide a low resistance heat path into the packaging from the device and provide the ability to spread the heat out away from the device.

For GaN HEMT devices, silicon carbide (SiC) substrates are currently the industry standard for providing the desirable characteristics of electrically insulating, highly thermally conductive, a close lattice match to that of GaN and a similar thermal expansion coefficient to that of GaN. SiC has a relatively high thermal conductivity, but the power dissipation is still limited by thermal constraints and the devices are not allowed to perform at their maximum levels. Although SiC is a good thermal conductor, its thermal conductivity is still limited, and as the junction temperature rises in the device, the ability of the SiC substrate and the heat sink to remove heat is limited, which limits the output power of GaN HEMT devices, and subsequently their reliability, as discussed above.

It is desirable to provide a suitable substrate for a GaN HEMT device that has a greater thermal conductivity than SiC. Diamond is electrically insulating and has the highest thermal conductivity of any bulk material. However, it is currently not possible to epitaxially grow GaN layers on large area single-crystal diamond substrates for many reasons, including availability, a large lattice constant mismatch and different thermal expansion coefficients.

Efforts have been made in the industry to overcome these problems so as to use diamond substrates in semiconductor devices, such as GaN HEMT devices. Diamond thermal vias have been previously conceived to improve the thermal resistance of semiconductor substrates by bringing high thermal conductivity diamond conduits close to the device active area where the heat is most concentrated.

U.S. Pat. No. 8,575,657 issued to Gambin et al. discloses a GaN HEMT device having a silicon carbide substrate including a via formed therein, where a diamond layer is provided within the via to dissipate heat generated by the device.

For certain semiconductor circuit applications, such as for high power amplifiers, GaN HEMT devices are employed in combination with various RF devices, waveguides, transmission lines, etc., where the HEMT devices provide a concentrated heat source in the circuit that needs to be spread out and directed to a heat sink typically at the bottom of the circuit. These types of GaN HEMT devices in monolithic microwave integrated circuit (MMIC) power amplifiers generate heat at a very high level where the maximum power density and performance of the devices can increase with the capability to dissipate additional heat. Further, mutual heating affects of neighboring device cells limit the GaN MMIC compaction which would otherwise lead to cost savings and performance improvements. For heat densities generated by these devices, the ability of SiC substrates and bulk diamond heat removal vias is often not enough to remove the desired amount of heat. In certain circuit designs, it is possible to place heat sinks in direct contact with the diamond layer so as to affectively remove heat therefrom for these types of applications. However, in some circuit designs, where other circuit components need to be placed where the heat sink is configured require the heat sink to be removed some distance from the diamond layer.

DETAILED DESCRIPTION OF THE EMBODIMENTS

The following discussion of the embodiments of the invention directed to a semiconductor circuit including a plurality of GaN semiconductor devices fabricated on a common substrate, where the substrate includes a diamond heat removal layer below each device and where a manifold is mounted to the substrate that includes impingement jets that spray a liquid cooling fluid onto the diamond layers is merely exemplary in nature, and is in no way intended to limit the invention or its applications or uses.

Figure 1:
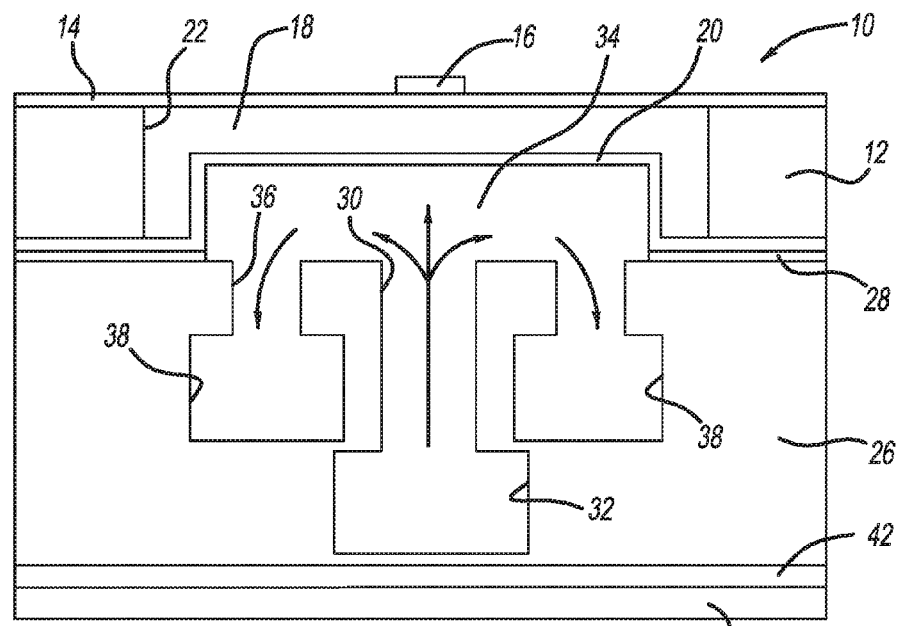
FIG. 1 is a profile view of a circuit assembly showing a microfluidic impingement jet being directed onto a diamond layer provided in a SiC substrate of a GaN HEMT device.

FIG. 1 is a profile view of a portion of a circuit assembly 10, such as a monolithic microwave integrated circuit (MMIC) power amplifier (PA) circuit assembly. The circuit assembly 10 includes a semiconductor substrate 12 that extends across the circuit assembly 10 and on which is fabricated a number of semiconductor devices using known semiconductor epitaxial fabrication processes. In this embodiment, the substrate 12 is a SiC substrate suitable for high power RF applications. However, in other embodiments, other substrates may be applicable, such as sapphire, GaN, AlN, silicon, etc. A number of semiconductor epitaxial layers represented generally as layer 14 are deposited and/or grown on the substrate 12 and may form part of a number of discrete circuits in the circuit assembly 10. The layer 14 may be part of any suitable circuit for the particular application, such as transistors, transmission lines, waveguides, etc. For example, the layer 14 may include nucleation layers, buffer layers, barrier layers, etc. A number of high electron mobility transistor (HEMT) devices 16 are fabricated on the substrate 12 and would include a number of known semiconductor layers in addition to the layer 14, where the specific configuration and layer profile of each HEMT device 16 could be application specific.

As mentioned above, HEMT devices for high power applications provide a highly concentrated heat source in the power amplifier circuit. Although the SiC substrate 12 is effective in removing heat from semiconductor devices, additional heat removal is often required. As mentioned above, U.S. Pat. No. 8,575,657 disclosed providing vias in SiC substrates directly below an HEMT device, where the via is filled with a diamond layer to spread the heat out away from the device. In the circuit assembly 10, a microchannel 22 of a suitable size is fabricated through the substrate 12 below each of the HEMT devices 16 using suitable semiconductor etching processes, and a diamond layer 18 is deposited in the microchannel 22 by, for example, a chemical vapor deposition (CVD) polycrystalline diamond deposition process. A metalized backside ground plane 20 is then deposited over the diamond layer 18 and the bottom surface of the substrate 12 by known fabrication techniques.

Although providing the diamond layer 18 in high power devices such as disclosed herein is effective in removing heat from the devices, the present invention proposes providing additional heat removing capabilities, and the ability to move heat sink devices (not shown) away from the substrate 12 by providing microfluidic impingement jets that direct a cooling fluid on to each of the diamond layers 18. In order to accomplish this, the circuit assembly 10 includes a manifold 26 being made of a suitable material that is able to be micro-machined to form an array of channels therein to provide the impingement jets and fluid deliver channels and return channels. In one non-limiting example, the manifold 26 is one or more layers of silicon and is joined to the ground plane 20 by a bonding layer 28, such as a euctectic solder bonding layer. A metal back-plane 40 is bonded to the manifold 26 opposite to the substrate 12 by a bonding layer 42, such as a euctectic bonding layer.

The manifold 26 includes an impingement channel 30 directly below each of the HEMT devices 16 that is in fluid communication with a cooling fluid supply channel 32 that allows the cooling fluid to create a microfluidic impingement jet at a desired flow velocity, pressure drop, and flow rate that is directed onto the diamond layer 18 to remove heat from the devices 16. Cooling fluid from the supply channel 32 is directed onto the diamond layer 18 as shown by the arrows to remove heat therefrom, where the heating fluid is then collected in a collection chamber 34 and directed to collection channels 36 in the manifold 26 and then to a return channel 38. The fluid impingement jet minimizes the boundary layer thermal resistance, thus enhancing local conjugate heat transfer under the HEMT devices 16. Heat is first spread from the channel hot spot in the diamond layer 18 before being transferred into the impinging fluid. The channels 30, 32 and 34 can be any suitable shape, such as rectangular, and any suitable size for the particular application so that the desired pressure drop and velocity of the fluid can be obtained for the best performance of heat removal. In one embodiment, the aperture size of the channels 30 and 36 may be in the 50-200 µm range. The cooling fluid can be any suitable cooling fluid for the purposes discussed herein, such as a glycol and water mixture.

Figure 2:
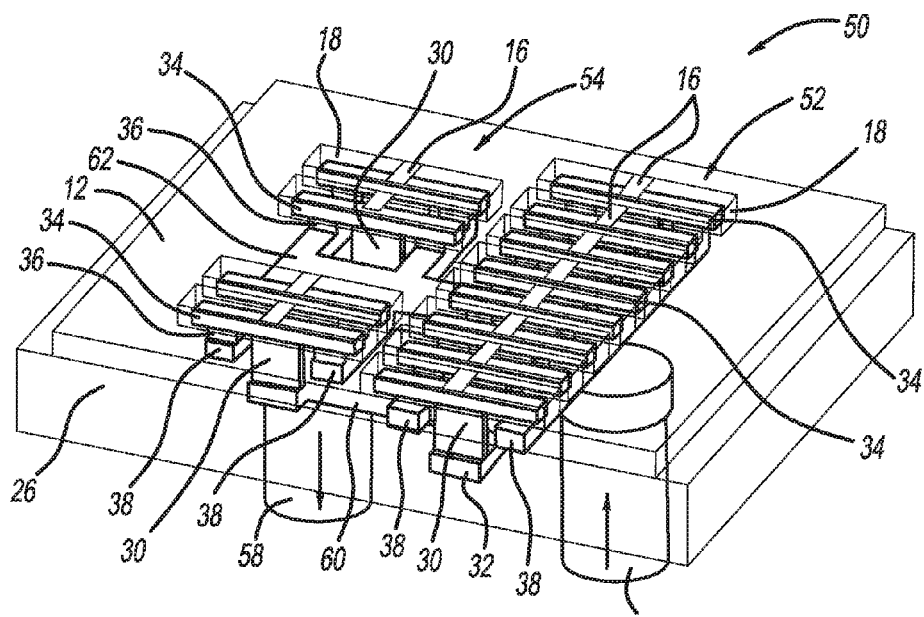
FIG. 2 is an isometric line drawing of the circuit assembly shown in FIG. 1.

As mentioned above, the circuit assembly 10 includes more than one of the HEMT devices 16, where the cooling fluid supply channel 32 provides the cooling fluid to all of the HEMT devices 16 and the return channel 38 collects the heated fluid from all of the devices 16. FIG. 2 is an isometric line drawing 50 of the circuit assembly 10 showing how the supply channel 32 and the return channel 38 in the manifold 26 may be configured in one non-limiting design to draw heat away from several of the HEMT devices 16, here twelve of the devices 16. In this configuration, the HEMT devices 16 are provided in two adjacent rows 52 and 54, where eight of the HEMT devices 16 are provided in the row 52 and four of the HEMT devices 16 are provided in the row 54. Further, a main supply line 56 supplies all of the supply channels 32 and a main return line 58 collects the heated fluid from all of the return channels 38. Channel 60 represents one of the channels that the supply cooling fluid is delivered from the row 52 to the row 54 and channel 62 represents a channel where the return fluid is directed to the return line 58. It is noted that this is just one example of how the cooling fluid can be provided to the diamond layer 18 below each HEMT device 16 in a particular circuit assembly, where other channel designs would also be applicable.

Figure 3:
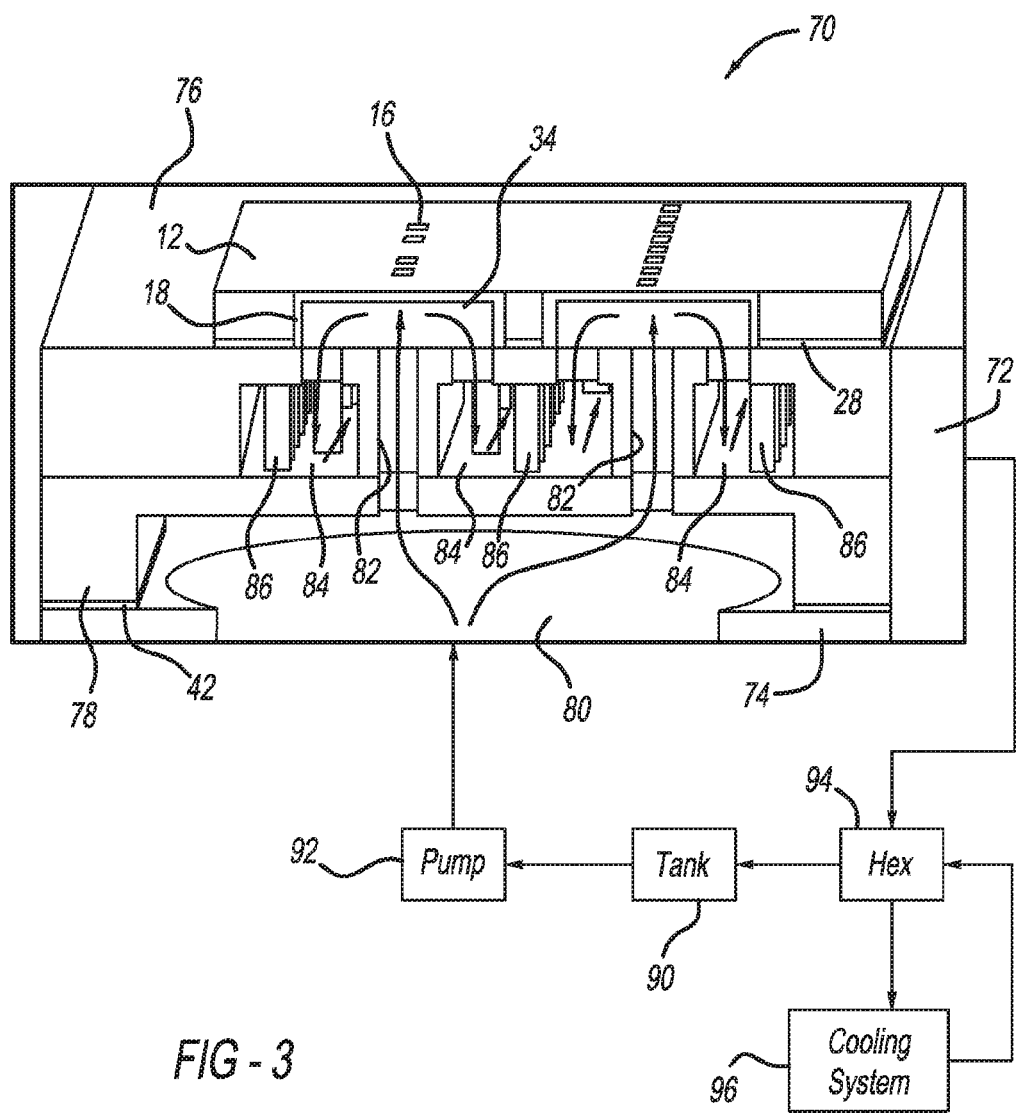
FIG. 3 is a cut-away isometric view of a circuit assembly similar to the circuit assembly shown in FIG. 1.

FIG. 3 is a cut-away, isometric view of an MMIC power amplifier circuit assembly 70 similar to the circuit assembly 10, where like elements are identified by the same reference number, and showing a different channel configuration than that illustrated in the line drawing 50. The circuit assembly 70 includes an outer housing or die 72 having a base plate 74. In this embodiment, the manifold 26 is replaced with an upper manifold 76 and a lower manifold 78 having a different channel configuration than the manifold 26, where a cooling fluid inlet line 80 delivers cooling fluid to multiple supply channels 82. Return channels 84 collect the heated fluid and include a series of posts, pins or fins 86 therein that also operate to collect heat from the substrate 12 and deliver it to the cooling fluid. Thus, more surface area is provided in the manifold 72 to deliver more heat to the cooling fluid to be removed from the circuits.

The circuit assembly 70 also shows some of the external components for providing the cooling fluid to the manifolds 76 and 78. The cooling fluid is stored in a tank 90 and is pumped by a pump 92 to the supply line 80. The return cooling fluid from the channels 84 is sent to a heat exchanger 94. A secondary cooling system 98 delivers cooling fluid to the heat exchanger 94 to remove the heat from the cooling fluid before it is sent back to the tank 90.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A circuit assembly comprising:
    a substrate including a top surface and a bottom surface, said substrate further including a plurality of microchannels formed through the bottom surface and into the substrate;
    a diamond layer provided within each of the microchannels in the substrate;
    a plurality of semiconductor devices provided on the top surface of the substrate where each semiconductor device is positioned directly opposite to a microchannel; and
    a manifold coupled to the bottom surface of the substrate and including a plurality of channels formed therein that include an impingement jet channel positioned adjacent each microchannel, a return channel positioned adjacent to each microchannel, a supply channel supplying a cooling fluid to the impingement jet channels and a return channel collecting heated cooling fluid from the supply channels so that an impingement jet of the cooling fluid is directed on to the diamond layer for removing heat generated by the semiconductor devices.

2. The circuit assembly according to claim 1 wherein the circuit assembly is a monolithic microwave integrated circuit (MMIC) power amplifier.

3. The circuit assembly according to claim 2 wherein the semiconductor devices are GaN high electron mobility transistor (HEMT) devices.

4. The circuit assembly according to claim 3 wherein the power amplifier includes multiple GaN HEMT devices provided in two or more rows.

5. The circuit assembly according to claim 1 further comprising a thermally conductive ground plane positioned between the bottom surface of the substrate and the manifold.

6. The circuit assembly according to claim 1 further comprising a ground plane bonded to a surface of the manifold opposite to the substrate.

7. The circuit assembly according to claim 1 wherein the substrate is a silicon carbide (SiC) substrate.

8. The circuit assembly according to claim 1 wherein the diamond layers are chemical vapor deposition polycrystalline diamond layers.

9. The circuit assembly according to claim 1 wherein the manifold is a micro-machined silicon manifold.

10. The circuit assembly according to claim 1 wherein the manifold includes a series of pins or fins positioned within the return channel.

11. A monolithic microwave integrated circuit (MMIC) power amplifier comprising:
    a SiC substrate including a top surface and a bottom surface, said substrate further including a plurality of microchannels formed through the bottom surface and into the substrate;
    a diamond layer provided within each of the microchannels in the substrate;
    a plurality of GaN high electron mobility transistor (HEMT) devices provided on the top surface of the substrate where each HEMT device is positioned directly opposite to a microchannel; and
    a silicon manifold coupled to the bottom surface of the substrate and including a plurality of micro-machined channels formed therein that include an impingement jet channel positioned adjacent each microchannel, a return channel positioned adjacent to each microchannel, a supply channel supplying a cooling fluid to the impingement channels and a return channel collecting heated cooling fluid from the supply channels so that an impingement jet is directed on to the diamond layer for removing heat generated by the HEMT devices.

12. The power amplifier according to claim 11 further comprising a thermally conductive ground plane positioned between the bottom surface of the substrate and the manifold.

13. The power amplifier according to claim 11 further comprising a ground plane bonded to a surface of the manifold opposite to the substrate.

14. The power amplifier according to claim 11 wherein the diamond layers are chemical vapor deposition polycrystalline diamond layers.

15. The power amplifier according to claim 11 wherein the manifold includes a series of pins or fins positioned within the return channel.

16. A circuit assembly comprising:
    a substrate including a top surface and a bottom surface, said substrate further including a microchannel formed through the bottom surface and into the substrate;
    a diamond layer provided within the microchannel in the substrate;
    a semiconductor device provided on the top surface of the substrate and being positioned directly opposite to the microchannel; and an impingement jet channel positioned adjacent the microchannel and directing an impingement jet of cooling fluid on to the diamond layer for removing heat generated by the semiconductor device.

17. The circuit assembly according to claim 16 wherein the impingement jet channel is provided in a micro-machined silicon manifold.

18. The circuit assembly according to claim 17 wherein the manifold includes a series of pins or fins positioned within a cooling fluid return channel.

19. The circuit assembly according to claim 16 wherein the semiconductor device is GaN high electron mobility transistor (HEMT) device and the substrate is silicon carbide (SiC) substrate.

20. The circuit assembly according to claim 16 wherein the diamond layers are chemical vapor deposition polycrystalline diamond layers.

* * * * *